United States Patent [19]
Huang et al.

[11] Patent Number: 6,083,789
[45] Date of Patent: Jul. 4, 2000

[54] METHOD FOR MANUFACTURING DRAM CAPACITOR

[75] Inventors: Kuo-Tai Huang; Wen-Yi Hsieh, both of Hsinchu; Tri-Rung Yew, Hsinchu Hsien, all of Taiwan

[73] Assignee: United Microelectronics Corp., Taiwan

[21] Appl. No.: 09/060,323

[22] Filed: Apr. 14, 1998

[30] Foreign Application Priority Data

Feb. 21, 1998 [TW] Taiwan ................................. 87102475

[51] Int. Cl.⁷ ............................................. H01L 21/8242
[52] U.S. Cl. ............................................. 438/254; 438/648
[58] Field of Search ................................. 438/253–256, 438/238–240, 381, 393–399, 648

[56] References Cited

U.S. PATENT DOCUMENTS 5,795,805 8/1998 Wu .......................................... 438/253
5,854,106 12/1998 Wu .......................................... 438/253

*Primary Examiner*—Jey Tsai
*Attorney, Agent, or Firm*—Blakely Sokoloff Taylor & Zafman

[57] ABSTRACT

A method for forming a DRAM capacitor whose titanium nitride electrode is fabricated in a sequence of steps that results in a good step-coverage. Moreover, contamination of the titanium nitride layer and cross-diffusion between the titanium nitride layer and the dielectric film layer is reduced to a minimum. The method of forming the titanium nitride layer includes the steps of depositing a first titanium nitride layer over a dielectric film layer using a conventional physical vapor deposition process. Then, a second titanium nitride layer is deposited over the first titanium nitride layer using a collimated physical vapor deposition process.

34 Claims, 11 Drawing Sheets

METHOD FOR MANUFACTURING DRAM CAPACITOR

CROSS-REFERENCE TO RELATED APPLICATION

This application claims the priority benefit of Taiwan application Ser. No. 87102475, filed Feb. 21, 1998, the full disclosure of which is incorporated herein by reference.

BACKGROUND OF THE INVENTION

1. Field of Invention

The present invention relates to a method for manufacturing integrated circuits. More particularly, the present invention relates to a method for manufacturing a dynamic random access memory (DRAM) capacitor.

2. Description of Related Art

As the microprocessor of a computer becomes more powerful, the amount of software programs that can be simultaneously run inside a computer increases exponentially. Consequently, the amount of memory space necessary for storing data must be increased, and so highly efficient memory capacitors are in great demand. As the level of integration of DRAM increases, DRAM cells are now constructed from just one transfer field effect transistor and a storage capacitor. FIG. 1 is an equivalent circuit diagram of a DRAM cell. A DRAM is normally constructed from an array of these cells. A binary bit is stored in the capacitor C of each cell. In general, when the capacitor C is uncharged, a logic state of "0" is defined. On the other hand, when the capacitor C is fully charged, a logic state of "1" is defined. A capacitor C has an upper electrode (cell electrode) 100 and a lower electrode (storage electrode) 102 with a layer of dielectric 101 sandwiched between the two to provide the necessary dielectric constant. In addition, the capacitor C is coupled to a bit line (BL), and reading and writing to and from the DRAM memory is achieved by charging or discharging the capacitor C. Charging and discharging of the capacitor C is carried out through the control of a transfer field effect transistor (TFET). The source terminal of the transfer transistor is connected to the bit line BL while the drain terminal of the transfer transistor is connected to the capacitor C. The transfer transistor T is switched on or off through a selection signal coming from a word line WL, which is connected to the gate terminal of the transfer transistor T. Hence, whether the capacitor C is connected to the bit line allowing for charging or discharging of the capacitor depends upon the selection signal passed to the gate terminal.

The capacitor can be regarded as the heart of a DRAM device. When the quantities of electric charges stored in a capacitor are increased, data amplified out from memory will be less affected by noise surrounding the communication system. In general, the charge storage capacity of a capacitor can be increased in several ways, including: 1) choosing a material having a high dielectric constant to form the dielectric film layer; 2) reducing the thickness of the dielectric film layer; and 3) increasing the surface area of a capacitor. Nowadays, many materials with high dielectric constant have been developed including tantalum pentoxide ($Ta_2O_5$), $Pb(Zr,Ti)O_3$ or PZT and $(Ba,Sr)TiO_3$ or BST. To increase the surface area of a capacitor, three-dimensional capacitors such as the so-called stacked type and trench type are now commonly used. For a 64 Mbit DRAM, for example, one method of further increasing the surface area of a capacitor is to extend the electrode and dielectric film layer horizontally and then stack the layers up to form a fin-type stacked capacitor. An alternative method is to allow the electrode and the dielectric film layer to extend vertically up to form a cylindrical-type stacked capacitor. Description related to the formation of a fin-type capacitor can be found in an article by Ema et al. with the title "3-Dimensional Stacked Capacitor Cell for 16M and 64M DRAMs", published in International Electron Devices Meeting, pp 592–595, December 1988, or U.S. Pat. No. 5,071,783, U.S. Pat. No. 5,126,810 and U.S. Pat. No. 5,206,787. Description related to the formation of a cylindrical-type capacitor can be found in another article by Wakamiya et al. with the title "Novel Stacked Capacitor Cell for 64 Mb DRAM", published in Symposium on VLSI Technology Digest of Technical Papers, pp 69–70, 1989, or U.S. Pat. No. 5,077,688.

FIGS. 2A through 2E are cross-sectional views showing the progression of manufacturing steps in forming a conventional cylindrical type DRAM capacitor. First, as shown in FIG. 2A, a DRAM field effect transistor 201 is formed over a substrate 200, for example, a P-type silicon substrate. The field effect transistor 201 includes a gate structure 203 and source/drain regions 208 and 209, and are formed in the active device region of the substrate 200 insulated from other regions by a field oxide layer 202. Next, a first dielectric layer 210 and a second dielectric layer 212 are sequentially formed over the substrate 200. The first dielectric layer 210 can be a borophosphosilicate glass (BPSG) layer formed, for example, by an atmospheric pressure chemical vapor deposition (APCVD) method. The second dielectric layer 212 can be a tetra-ethyl-ortho-silicate glass (TEOS) silicon oxide layer formed, for example, by an atmospheric pressure chemical vapor deposition (APCVD) method using TEOS as gaseous reactant. Alternatively, the first dielectric layer 210 can be a TEOS silicon oxide layer and the second dielectric layer 212 can be a BPSG layer.

Next, as shown in FIG. 2B, conventional photolithographic and etching processes are used to pattern the first dielectric layer 210 and the second dielectric layer 212. Consequently, a contact window 214 and a wide opening 216 exposing source/drain region 208 are formed.

Next, as shown in FIG. 2C, a conductive material, for example, a doped polysilicon layer, is deposited over the substrate 200 and the wide opening 216 and into the contact window 214 forming a conductive layer 218. The conductive layer 218 is electrically coupled to the source/drain region 208 and serves as a storage electrode for the capacitor.

Thereafter, as shown in FIG. 2D, the conductive layer 218 is planarized, for example, by a chemical-mechanical polishing (CMP) operation. The conductive layer 218 is polished to expose the second dielectric layer 212. Then, the second dielectric layer 212 is removed to expose the outer portion of the conductive layer 218 using, for example, an isotropic etching process. Subsequently, a dielectric film layer 220, preferably having a thickness of about 10 Å to 60 Å, is formed over the exposed conductive layer 218. The dielectric film layer 220 can be a silicon oxide layer, a silicon nitride/silicon oxide (NO) composite layer, a silicon oxide/silicon nitride/silicon oxide (ONO) composite layer, or composed from high dielectric constant materials such as tantalum pentoxide ($Ta_2O_5$), $Pb(Zr,Ti)O_3$ or PZT and $(Ba, Sr)TiO_3$ or BST.

Finally, as shown in FIG. 2E, another conductive layer 222 is formed over the dielectric film layer 220. The conductive layer 222 functions as a cell electrode of the capacitor. In general, when the dielectric film layer 220 is made from high dielectric constant material such as tantalum pentoxide, the conductive layer 222 can be made from a highly conductive titanium nitride (TiN) material. The titanium nitride layer can be deposited over the dielectric film layer 220 using, for example, a physical vapor deposition method. After the formation of the conductive layer 222, the processing steps necessary for fabricating a conventional DRAM capacitor are complete.

In the above conventional method of fabrication, when the second dielectric layer 212 is removed by etching in order to expose the conductive layer 218, over-etching will often occur around area 230 as shown in FIG. 2D. To better describe the problems caused by over-etching a more detailed view of the area 230 is shown in FIG. 2F. FIG. 2F is a magnified view of the area enclosed inside the dashed rectangle of FIG. 2D. Since any residual second dielectric layer on the conductive layer 218 is undesirable and may lead to subsequent electrical problems, over-etching is often preferred. However, over-etching may result in damages to the first dielectric layer 210 as shown in the recess area 230 in FIG. 2F. Furthermore, the corner space 230a in the recess area 230 will make subsequent deposition of dielectric film layer 220 and conductive upper electrode layer 222 incomplete, thereby leading to current leakage.

In another aspect, the above method of fabrication uses a physical vapor deposition method to achieve the formation of a titanium nitride layer acting as a cell electrode. However, due to the increase in level of integration, using physical vapor deposition cannot provide the kind of step coverage necessary for a good deposition resulting in a configuration as shown in FIG. 2E. Hence, a method having a better step-coverage such as chemical vapor deposition (CVD) is employed to deposit the titanium nitride layer. For example, a metal-organic CVD (MOCVD) method can be used to deposit titanium nitride over a tantalum pentoxide dielectric film. Alternatively, a CVD method can be used to deposit titanium nitride over a tantalum pentoxide dielectric film by first reacting it with the reactive gas titanium tetrachloride ($TiCl_4$) at a temperature of about 500° C., and then followed by heating it to about 850° C. in the presence of gaseous nitrogen to anneal the titanium nitride layer. However, in practice, the titanium nitride layer formed by the MOCVD method can easily be contaminated by carbon in the gaseous source, while the titanium nitride layer formed by the CVD technique of deposition is contaminated by the chlorine derived from the reactive gas (titanium tetrachloride).

FIGS. 3A and 3B show X-ray photoelectron spectroscopy (XPS) depth profiles before and after annealing a titanium nitride layer above the tantalum pentoxide dielectric film using a temperature of about 850° C. in the presence of gaseous nitrogen, where the titanium nitride layer is first deposited over the tantalum pentoxide by a CVD method using titanium tetrachloride as the reactive gas at a temperature of about 500° C. From the profile shown in FIGS. 3A and 3B, cross-diffusion between the titanium nitride layer and the tantalum pentoxide dielectric film is severe, thereby providing an additional source of current leakage from the device.

In light of the foregoing, there is a need provide an improved method of fabricating a DRAM capacitor.

SUMMARY OF THE INVENTION

Accordingly, the present invention is to provide a method for manufacturing a DRAM capacitor that can avoid the formation of recesses in the lower electrode surface during the dielectric layer etching operation so that leakage current from the capacitor is minimized.

In another aspect, the present invention is to provide a method for forming the cell electrode of a DRAM capacitor such that the titanium nitride layer, which acts as a cell electrode, is formed to have a good step coverage and yet still be able to avoid material contamination and cross-diffusion with the dielectric film layer beneath.

To achieve these and other advantages and in accordance with the purpose of the invention, as embodied and broadly described herein, the invention provides a method for manufacturing a DRAM capacitor. The method comprises the steps of providing a substrate, and then forming a field effect transistor above the substrate. Thereafter, a lower dielectric layer and an inter-layer dielectric layer are sequentially formed over the substrate. Next, the inter-layer dielectric layer is patterned to form a narrow opening. In the subsequent step, an upper dielectric layer is formed over the inter-layer dielectric layer, and then the upper dielectric layer is etched to form a pattern having a wide opening that exposes the narrow opening. Then, the etching continues down through the narrow opening, transferring its pattern to the lower dielectric layer. Consequently, a contact opening that exposes a source/drain region of the transistor is formed. Thereafter, a conductive layer serving as the lower electrode is formed over the upper dielectric layer, and then the upper dielectric layer is removed by etching using the inter-layer dielectric layer as an etching stop layer. The inter-layer dielectric layer protects the lower dielectric layer against the formation of recesses. Next, a dielectric film layer is formed over the conductive layer. Finally, a first titanium nitride layer is formed over the dielectric film layer using a physical vapor deposition method. Finally, another physical vapor deposition using a collimator is carried out to deposit a second titanium nitride layer over the first titanium nitride layer. The second titanium nitride layer is able to provide good step coverage so that a high quality cell electrode is formed. Furthermore, the first and the second titanium nitride layers are not contaminated by contaminants as in a conventional method and there is very little crossdiffusion between the titanium nitride layer and the dielectric film layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
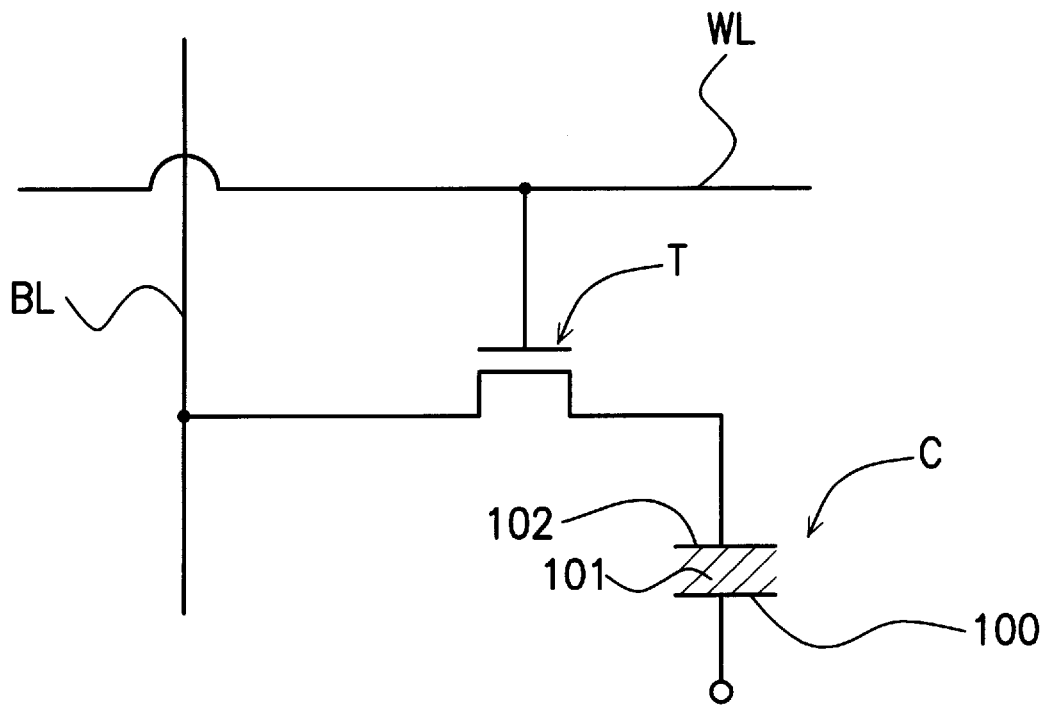
FIG. 1 is an equivalent circuit diagram of a DRAM cell.

Reference will now be made in detail to the present preferred embodiments of the invention, examples of which are illustrated in the accompanying drawings. Wherever possible, the same reference numbers are used in the drawings and the description to refer to the same or like parts.

FIGS. 4A through 4E are cross-sectional views showing the progression of manufacturing steps in forming a DRAM capacitor according to one preferred embodiment of this invention.

Figure 4A:
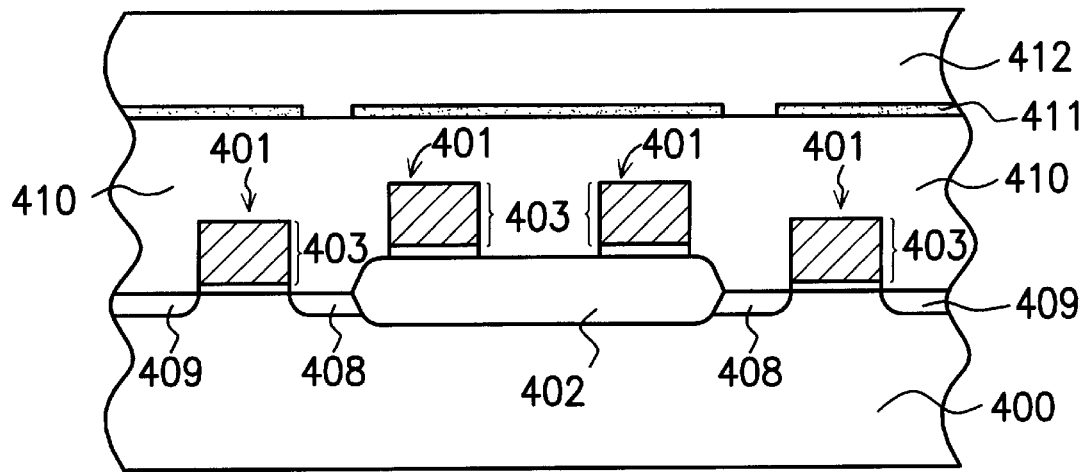
FIGS. 4A through 4E are cross-sectional views showing the progression of manufacturing steps in forming a DRAM capacitor according to one preferred embodiment of this invention.

First, as shown in FIG. 4A, a DRAM field effect transistor 401 is formed over a substrate 400, for example, a P-type silicon substrate. The field effect transistor 401 includes a gate structure 403 and source/drain regions 408 and 409, and is formed in the active device region of the substrate 400. Field effect transistor 401 is insulated from other regions by a field oxide layer 402. Next, a lower dielectric layer 410 and an inter-layer dielectric layer 411 are sequentially formed over the substrate 400. The lower dielectric layer 410 can be a borophosphosilicate glass (BPSG) layer or a tetraethyl-ortho-silicate ethyl-ortho-silicate (TEOS) silicon oxide layer formed, for example, by an atmospheric pressure chemical vapor deposition (APCVD) method. The inter-layer dielectric layer 411 can be a silicon nitride ($SiN_x$) or a silicon oxynitride ($SiN_xO$) formed, for example, by a chemical vapor deposition method. Thereafter, conventional photolithographic and etching processes are used to pattern the inter-layer dielectric layer 411 to form a narrow opening 414. Subsequently, an upper dielectric layer is formed over the inter-layer dielectric layer 411 and the lower dielectric layer 410. The upper dielectric layer 412 can be a borophosphosilicate glass (BPSG) layer or a tetra-ethyl-ortho-silicate (TEOS) silicon oxide layer formed, for example, by an atmospheric pressure chemical vapor deposition (APCVD) method.

Figure 4B:
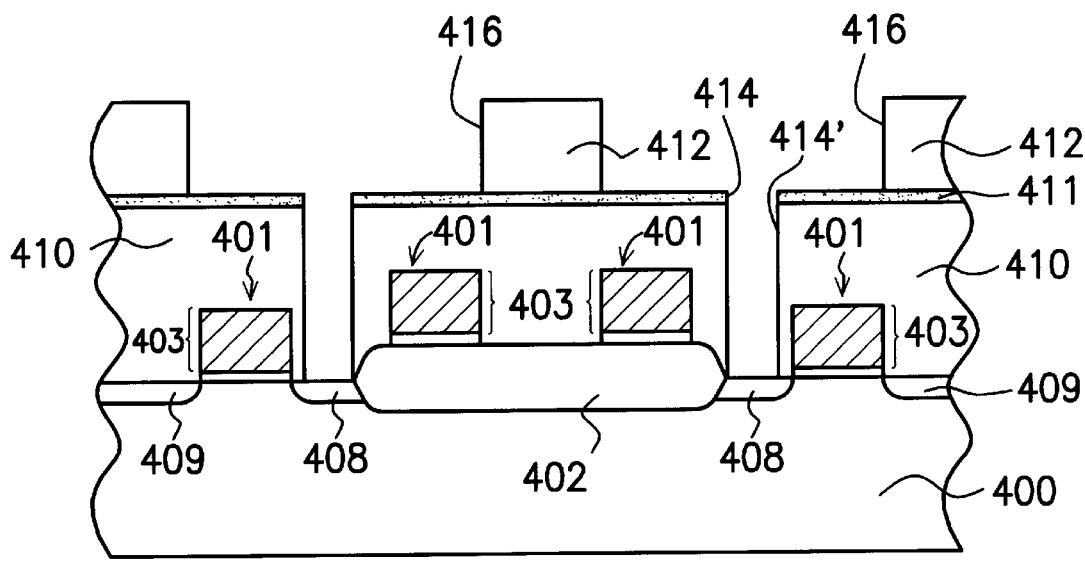

Next, as shown in FIG. 4B, conventional photolithographic and then etching process such as an anisotropic etching operation are used to pattern the upper dielectric layer 412 forming a wide opening 416 that exposes the narrow opening 414. The etching operation will continued down, transferring the narrow opening pattern 414 in the inter-layer dielectric layer 411 to the lower dielectric layer 410 and forming a contact opening 414' that exposes a source/drain region 408. Since the material of the inter-layer dielectric layer 411 (made from silicon nitride or silicon oxynitride) is different from that of the upper dielectric layer 412 (made from borophosphosilicate glass or TEOS silicon oxide), the inter-layer dielectric layer can serve as an etching stop layer for patterning the upper dielectric layer.

Figure 4C:
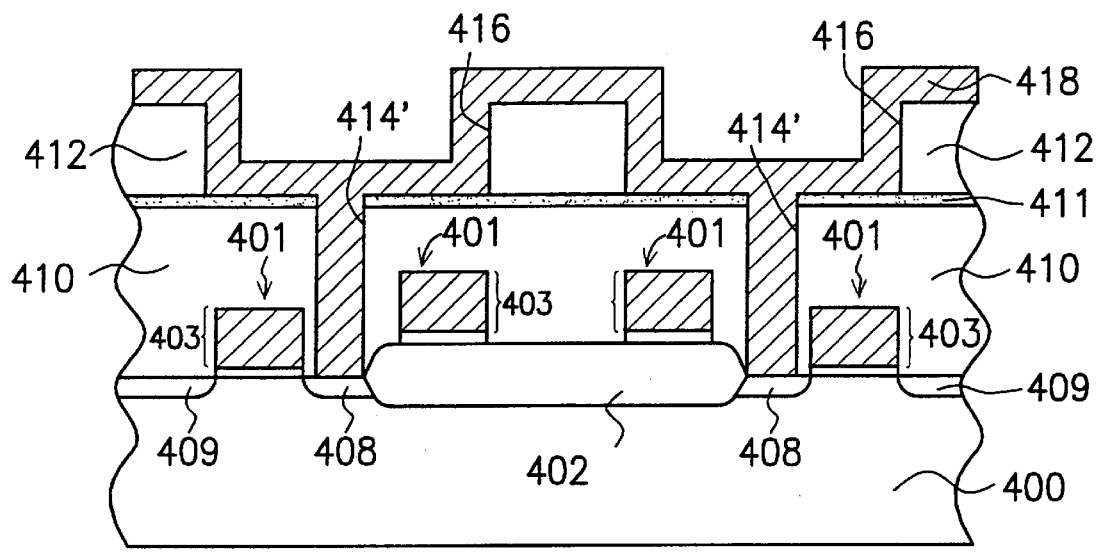

Next, as shown in FIG. 4C, conductive material, for example, impurities-doped polysilicon, is deposited over the substrate 400 to form a conductive layer 418. Alternatively, an additional hemispherical grained silicon (HSG) layer can be formed over the conductive layer 418 to form a composite conductive layer 418. The conductive layer 418 covers the opening 416, and also fills up the contact window 414' so that the conductive layer 418 is electrically coupled to the source/drain region 408. This conductive layer 418 later functions as the storage electrode of the capacitor.

Figure 2A:
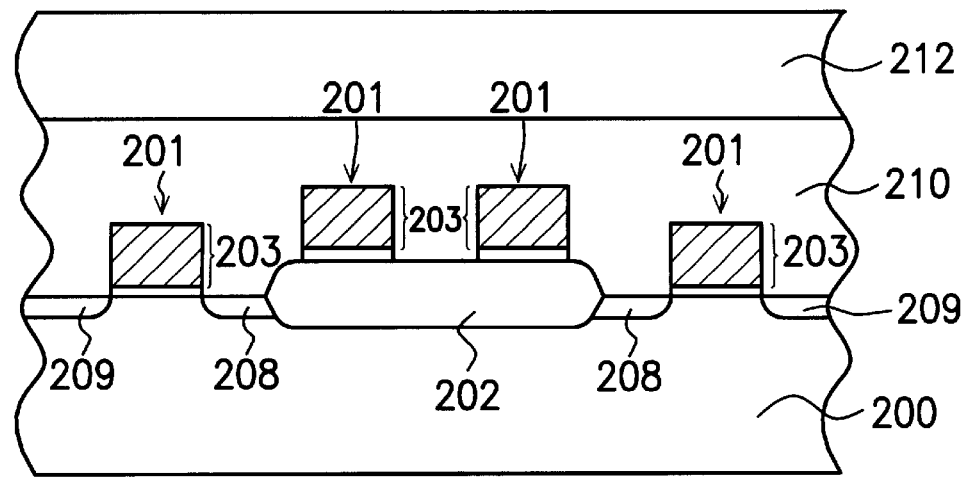
FIGS. 2A through 2E are cross-sectional views showing the progression of manufacturing steps in forming a conventional cylindrical type DRAM capacitor.
Figure 2B:
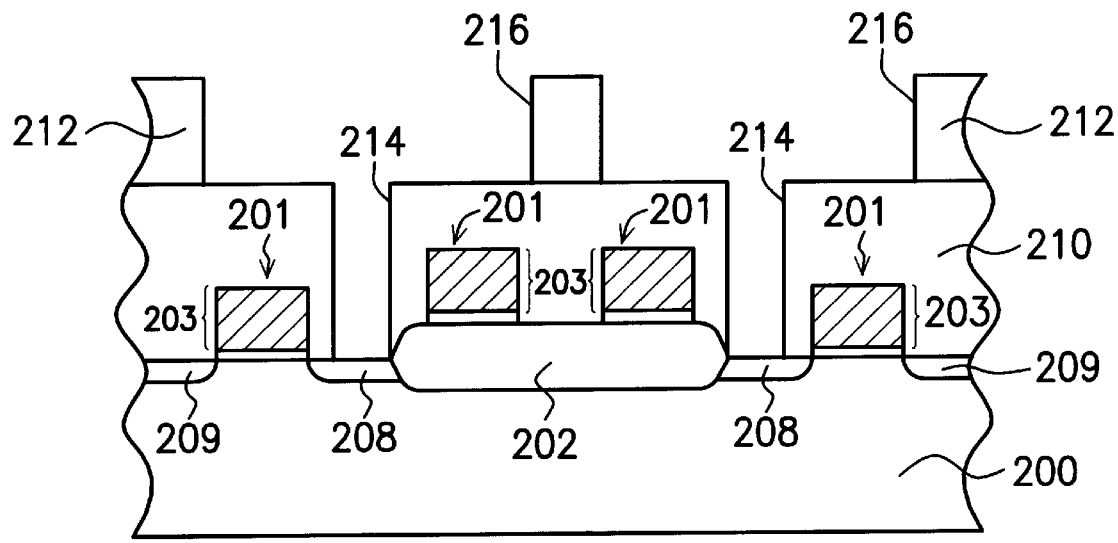
Figure 2C:
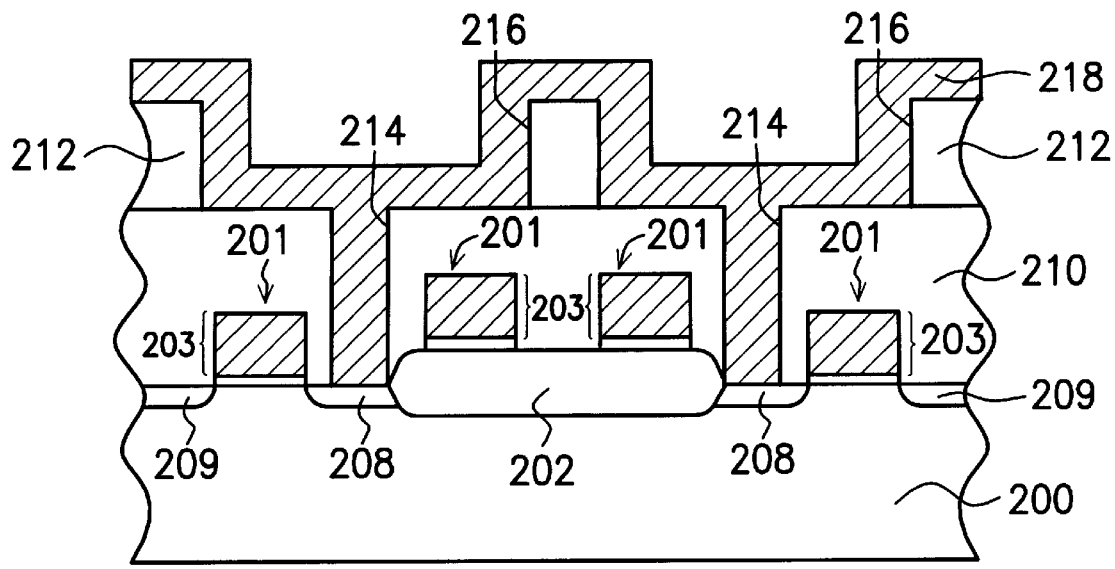
Figure 2D:
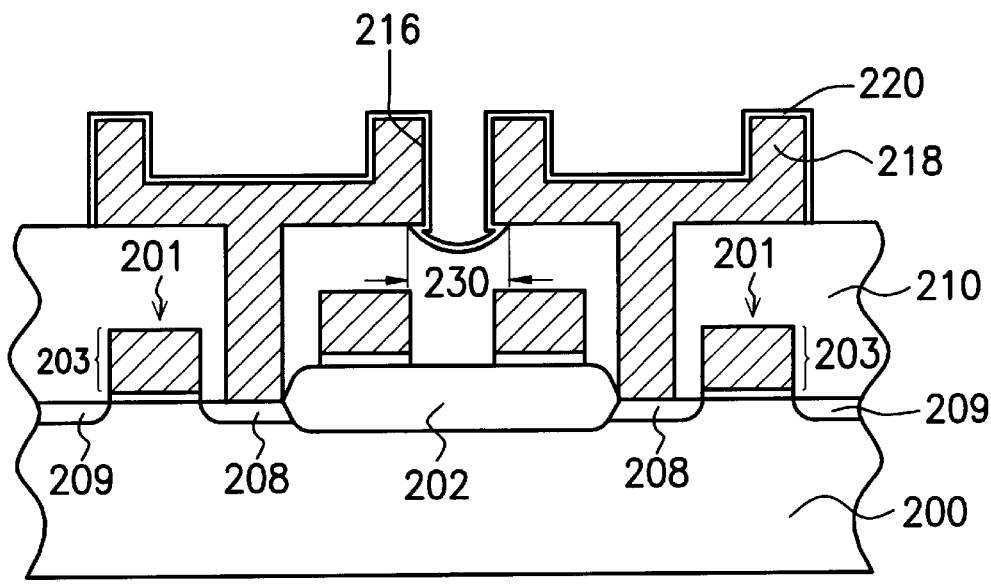
Figure 2E:
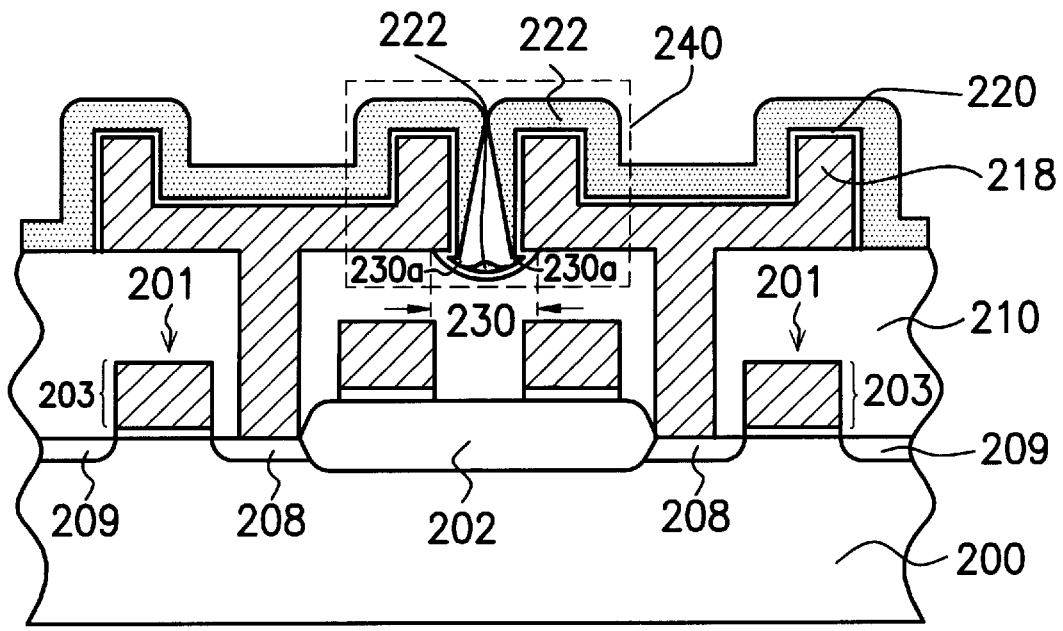
Figure 2F:
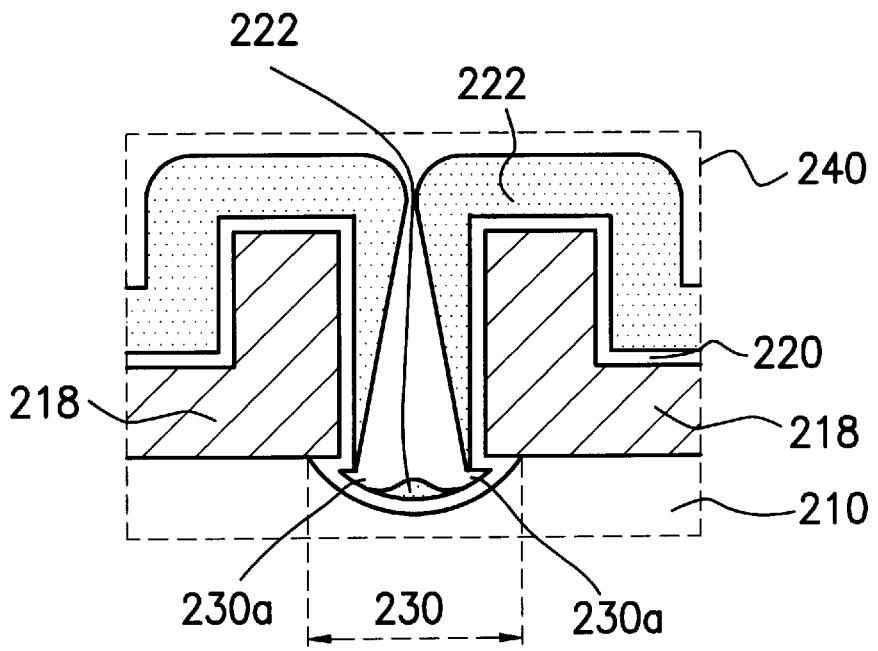
FIG. 2F is a magnified view of the area enclosed inside the dashed rectangle of FIG. 2D.
Figure 4D:
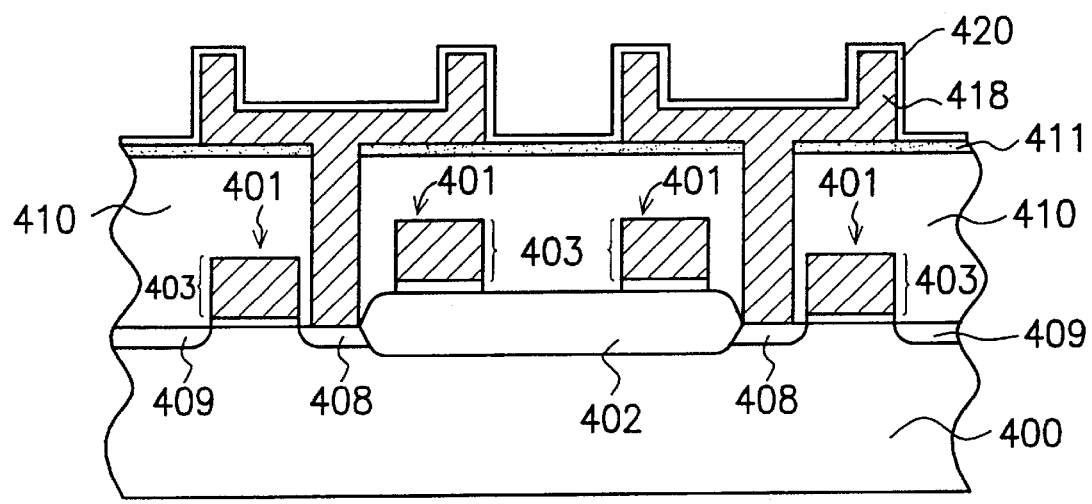

Next, as shown in FIG. 4D, the conductive layer 418 is planarized using, for example, a chemical-mechanical polishing method. The conductive layer 418 is polished until the upper dielectric layer 412 is exposed. Thereafter, the upper dielectric layer 412 is removed until the outline of the conductive layer 418 is exposed. The upper dielectric layer 412 can be removed using, for example, an isotropic etching process or an anisotropic etching process. Since the inter-layer dielectric layer 411 and the upper dielectric layer 412 are made from different materials, the inter-layer dielectric layer 411 can serve as an etching stop layer for the removal of the upper dielectric layer 412. With the etching stop layer 411 in place, over-etching of the dielectric layer 212 resulting in the formation of recesses in the dielectric layer 210 as shown in FIGS. 2C, 2D and 2F will not happen here. Subsequently, a dielectric film layer 420 preferably having a thickness of about 10 to 60 is formed over the exposed conductive layer 418. The dielectric film layer 420 can be made from high dielectric constant materials such as tantalum pentoxide ($Ta_2O_5$), $Pb(Zr,Ti)O_3$ or PZT, or $(Ba,Sr)TiO_3$ or BST.

Figure 4E:
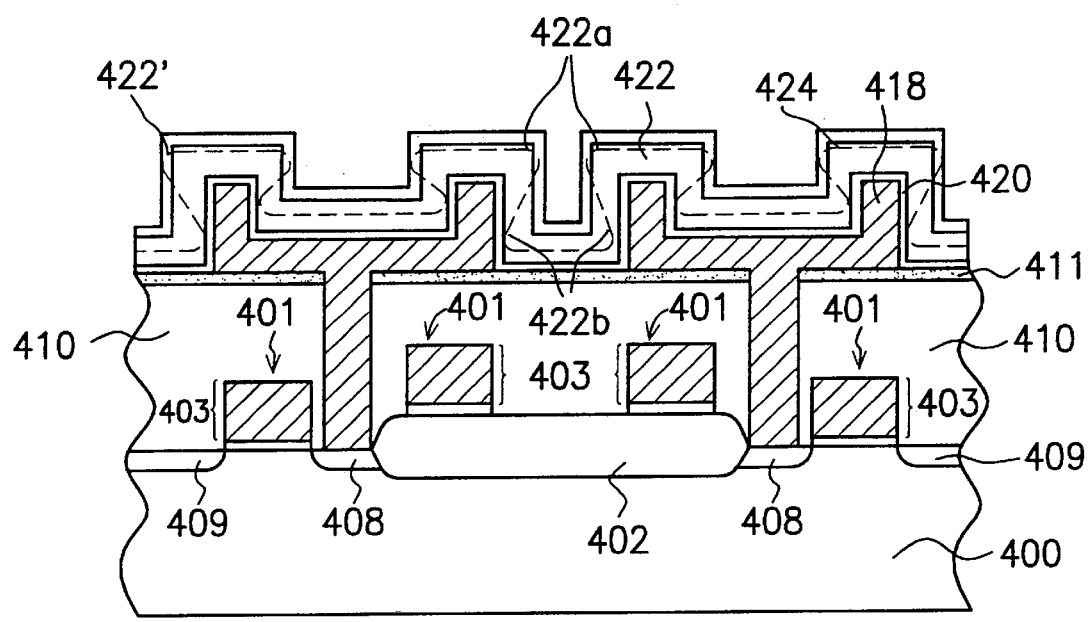

Next, as shown in FIG. 4E, another conductive layer 422 is formed over the dielectric film layer 420; conductive layer 422 acts as a cell electrode. In general, when the dielectric film layer 420 is made from tantalum pentoxide, titanium nitride material is most often used to form the conductive layer 422. Preferably, an additional layer of doped polysilicon or tungsten silicide ($WSi_x$) 424 is also deposited over the titanium nitride layer. The additional polysilicon or tungsten silicide layer can act as an etching stop layer in subsequent patterning operations. Moreover, they can also prevent the titanium nitride layer from reacting with the subsequently deposited borophosphosilicate glass layer, which reaction would form an unwanted buffer layer of titanium oxide ($TiO_2$). Subsequently, conventional photolithographic and etching processes are again used to pattern the conductive layer 422 to complete the fabrication of a DRAM storage capacitor.

One major aspect of this invention lies in the method of forming the titanium nitride layer 422. The method of forming the titanium nitride layer 422 comprises the steps of first depositing a pure, contaminant-free layer of titanium nitride layer 422' over the tantalum pentoxide dielectric film layer 420 using a physical vapor deposition method as shown by the dashed line in FIG. 4E. Then, another titanium nitride layer is deposited over the titanium nitride layer 422', also using a physical vapor deposition method but with a collimator this time. Finally, gaseous nitrogen is added and the reaction chamber is heated to a temperature of about 850° C. to perform an annealing operation. Thus, the fabrication of a titanium nitride layer 422 is complete. The titanium nitride layer 422 functions as a cell electrode for the capacitor.

The embodiment of this invention can be applied to form a capacitor over bitline (COB) or capacitor under bit-line (CUB) type of DRAM. Subsequently, although not drawn in FIG. 4E, conventional techniques are applied to form the necessary bonding pads, interconnects, passivation layer and packaging for completing the fabrication of a DRAM integrated circuit. Since these processing steps are outside the scope of this invention, detailed description is omitted here.

In the preferred embodiment of this invention, the doped impurities of the conductive layer 418, beside arsenic ions and phosphorus ions, can be other types of ions having similar properties. Furthermore, doping of impurities into the conductive layer 418 can be achieved through one of the following three methods: 1) using an ion implantation method to implant the necessary impurities with the correct concentration level into the polysilicon layer after the polysilicon is formed; 2) using a chemical vapor deposition method to deposit polysilicon and at the same time dope the necessary impurities with the correct concentration level into the polysilicon layer; and 3) using a chemical vapor deposition method to deposit a layer of polysilicon, and then using a heat diffusion method to diffuse the necessary impurities into the polysilicon layer right up to the desired concentration level.

Simply using a conventional physical vapor deposition method without a collimator to form the titanium nitride layer 422' is unable to provide sufficient step-coverage. Only when a second titanium nitride layer deposition using a collimated physical vapor deposition method is performed can the protruding titanium nitride layer 422a in the corner areas be shaved off and dumped back to the thinly covered area 422b. Consequently, a smooth titanium nitride layer 422 having sufficient step-coverage is formed. However, if the titanium nitride layer is deposited by a collimated physical vapor deposition method first, and then goes through a second deposition without a collimator to deposit the second layer of titanium nitride, then protrusions at the corners cannot be eliminated and step-coverage will be poor. Therefore, the method of forming the titanium nitride layer relies critically on deposition of a layer of titanium nitride using a physical vapor deposition without a collimator first, and then deposition of another titanium nitride layer on top using a physical vapor deposition with a collimator in order to get a smooth titanium layer.

Figure 3A:
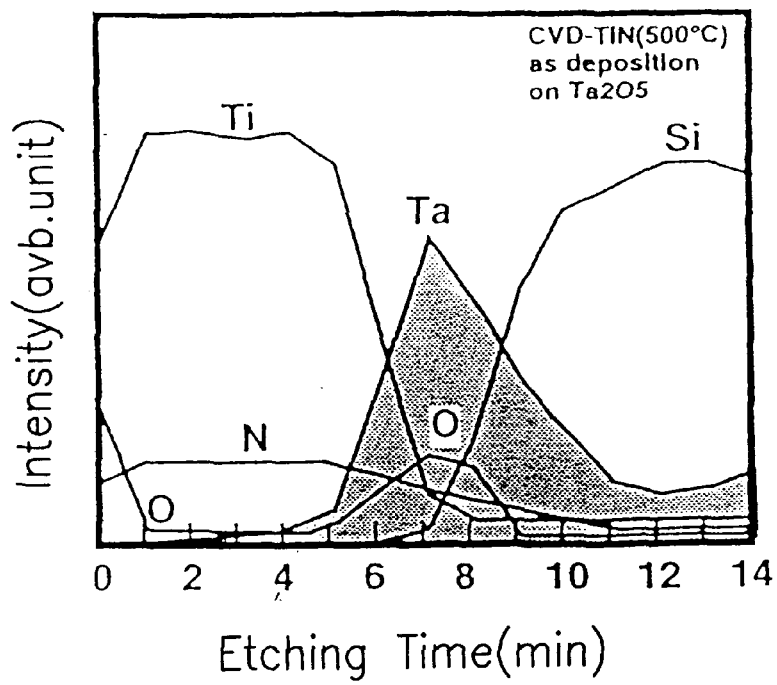
FIGS. 3A and 3B show X-ray photoelectron spectroscopy (XPS) depth profiles before and after annealing a titanium nitride layer fabricated by a conventional method.
Figure 3B:
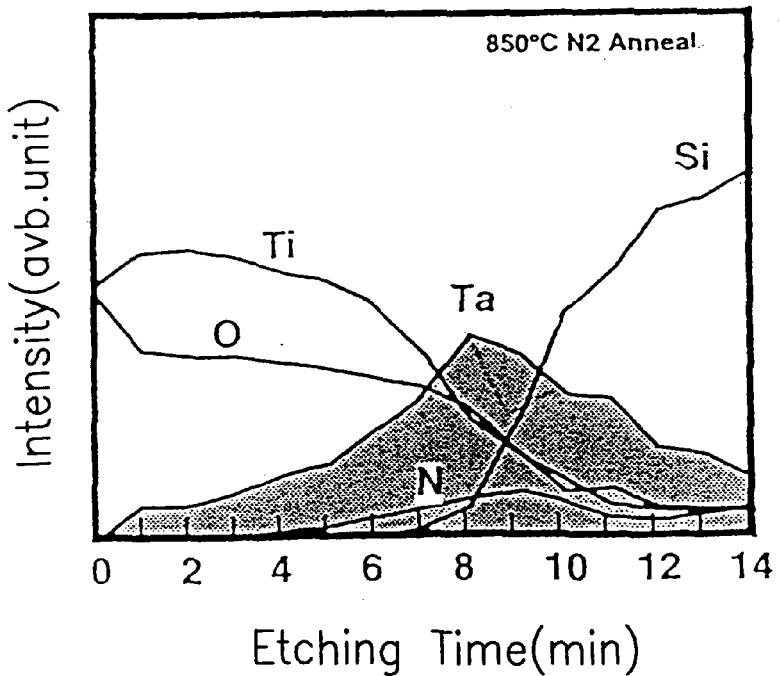
Figure 5A:
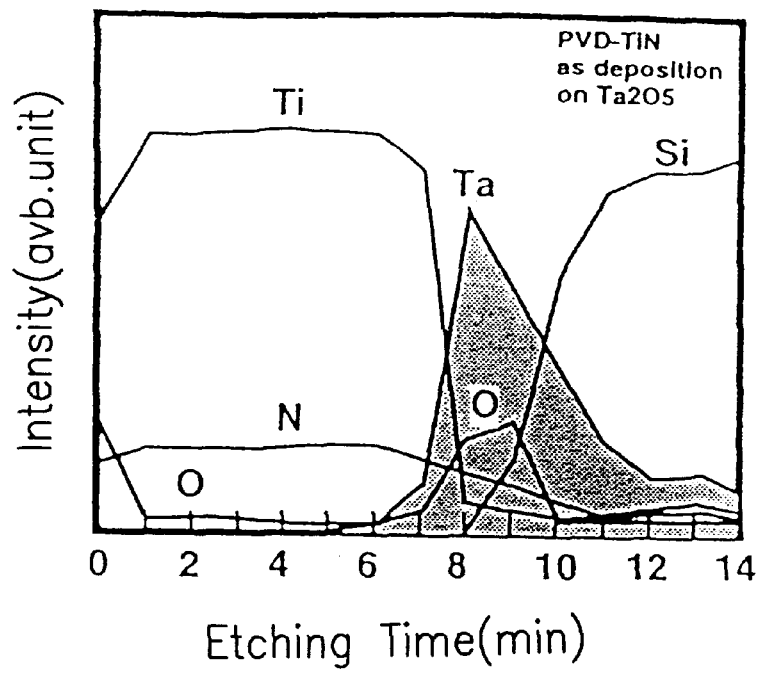
FIGS. 5A and 5B show X-ray photoelectron spectroscopy (XPS) depth profiles before and after annealing a titanium nitride layer fabricated according to one preferred embodiment of this invention.
Figure 5B:
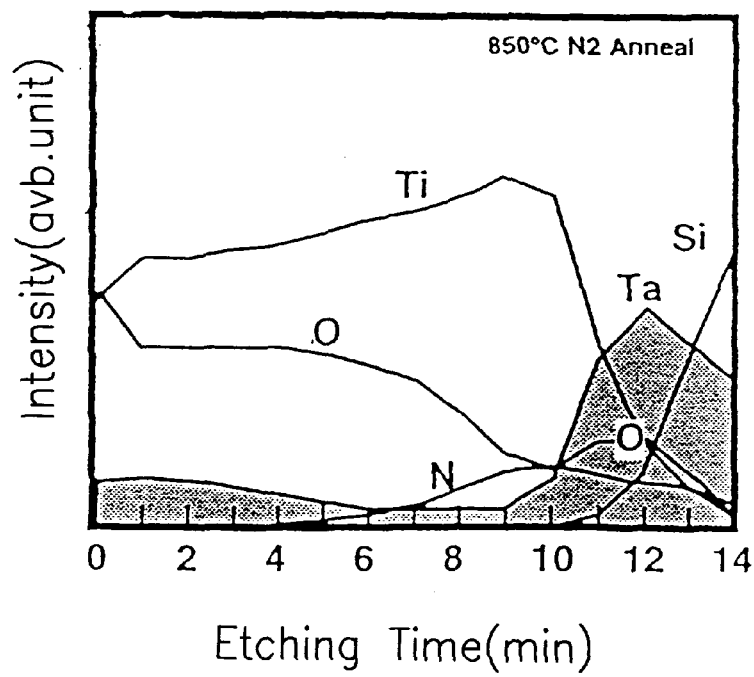
Figure 6:
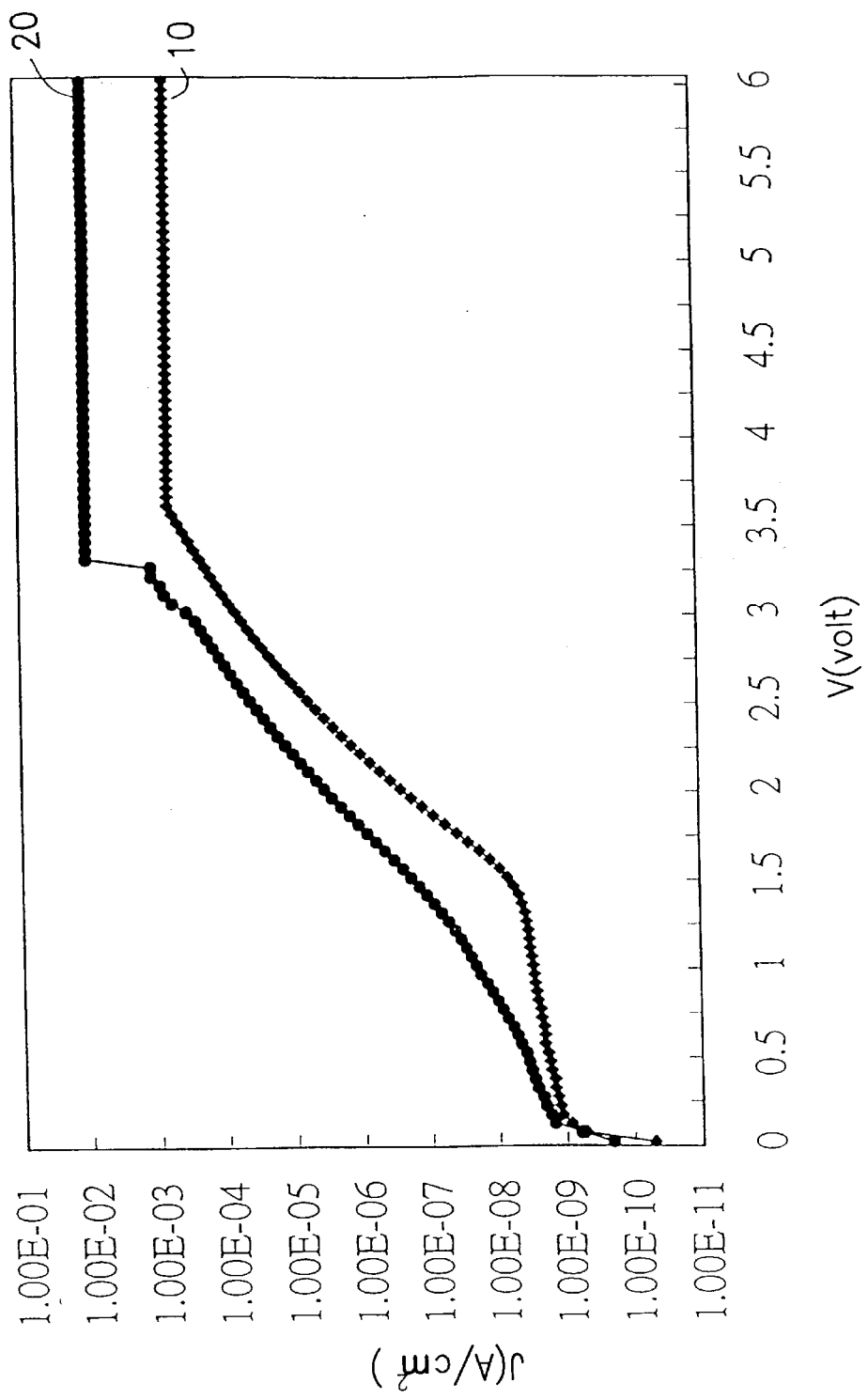
FIG. 6 is a graph showing the current density versus voltage relationship of a short loop capacitor contrasting the difference between a conventional DRAM and a DRAM fabricated according to this invention.
Figure 7:
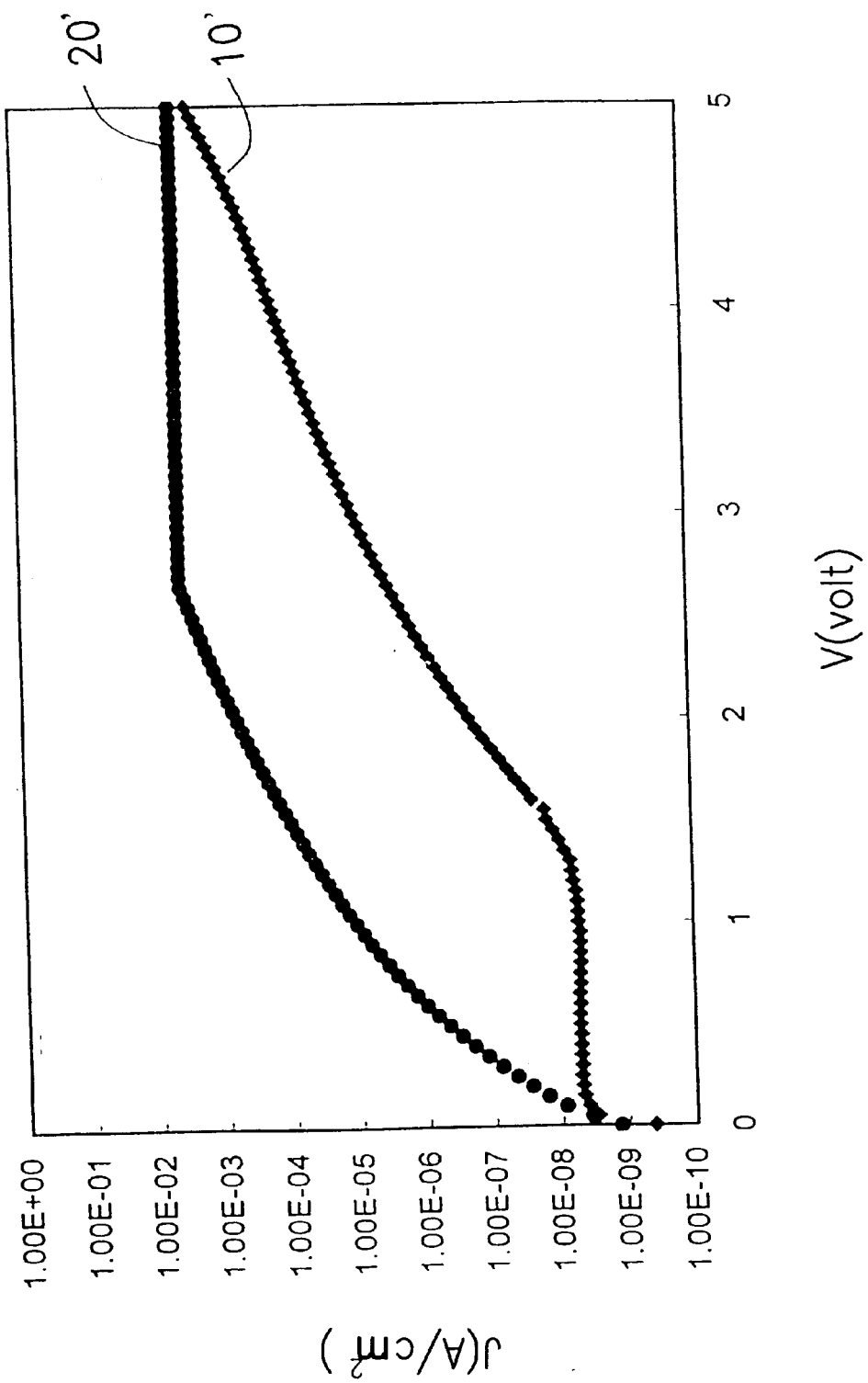
FIG. 7 is a graph showing the current density versus voltage relationship after the completion of the integrated circuit, to compare the difference between a conventional DRAM and a DRAM fabricated according to this invention.

FIGS. 5A and 5B show X-ray photoelectron spectroscopy (XPS) depth profiles before and after annealing the titanium nitride layer 422 above the tantalum pentoxide dielectric film 420 at a temperature of about 850° C. in the presence of gaseous nitrogen, where the titanium nitride layer is deposited over the tantalum pentoxide according to the method used in the embodiment of this invention. From FIGS. 5A and 5B, cross-diffusion between the titanium nitride layer 422 and the tantalum pentoxide layer 420 is greatly reduced compared with the conventional method as shown in FIGS. 3A and 3B. Therefore, the current density versus voltage curves 10 and 20 of a short loop capacitor as shown in FIG. 6 and the current density versus voltage curves 10' and 20' after the completion of the integrated circuit as shown in FIG. 7 show a marked difference between a conventional DRAM capacitor and a DRAM capacitor fabricated according to this invention. At a voltage level smaller than 5V, leakage current from the device fabricated according to this invention (curve 10 in FIG. 6 and 10' in FIG. 7) is considerably lower than the same device fabricated according to a conventional method (curve 20 in FIG. 6 and 20' in FIG. 7). Moreover, when the applied voltage is less than 1.5V, a characteristic constant current will flow in the device fabricated according to this invention.

As a summary, the characteristics of DRAM capacitor fabricated using the method of this invention include:
1. The introduction of an inter-layer dielectric layer between the upper dielectric layer and the lower dielectric layer is able to prevent the formation of recesses while an etching operation is carried out to remove the upper dielectric layer. Hence, leakage current is reduced.
2. The fabrication of a titanium nitride cell electrode includes the steps of first depositing a layer of titanium nitride using a conventional physical vapor deposition method, and then depositing another layer of titanium nitride on top using a collimated physical vapor deposition method. Through this sequence of operations, sufficient step-coverage is provided to the titanium nitride layer. Moreover, contamination and cross-diffusion with the dielectric film layer is reduced to a minimum. Therefore, leakage current will decrease.
3. The fabrication process used in this invention is compatible with other conventional processes. Therefore, the procedures are easy to adopt in a production line.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a DRAM capacitor comprising:
    providing a substrate having field effect transistor formed thereon, wherein the field effect transistor includes a source region and a drain region;
    forming a first dielectric layer and then an inter-layer dielectric layer over the substrate;
    etching the inter-layer dielectric layer to form a pattern having a narrow opening;
    forming a second dielectric layer over the inter-layer dielectric layer;
    etching the second dielectric layer to form a pattern having a wide opening exposing the narrow opening, then continuing etching down through the first dielectric layer, transferring the pattern on the narrow opening to the first dielectric layer and forming a contact window that exposes a source/drain region;
    forming a first conductive layer over the substrate covering the wide opening and completely filling the contact window so that the conductive layer is electrically coupled to the exposed source/drain region;
    removing the second dielectric layer to expose the inter-layer dielectric layer and the conductive layer;
    forming a dielectric film layer over the exposed first conductive layer;
    forming a first titanium nitride layer over the dielectric layer; and
    forming a second titanium nitride layer over the first titanium nitride layer, wherein the first titanium nitride layer and the second titanium nitride layer together form a cell electrode.

2. The method of claim 1, wherein the step of forming the first dielectric layer and the second dielectric layer includes depositing silicon dioxide.

3. The method of claim 1, wherein the step of forming the first dielectric layer and the second dielectric layer includes depositing borophosphosilicate glass.

4. The method of claim 1, wherein the material for forming the first dielectric layer and the second dielectric layer is different from the material used for forming the inter-layer dielectric layer.

5. The method of claim 1, wherein the step of forming the inter-layer dielectric layer includes depositing silicon nitride.

6. The method of claim 1, wherein the step of forming the inter-layer dielectric layer includes depositing silicon oxynitride.

7. The method of claim 1, wherein the step of etching the inter-layer dielectric layer to form a pattern includes an anisotropic etching method.

8. The method of claim 1, wherein the step of etching the second dielectric layer to form a pattern includes using the inter-layer dielectric layer as an etching stop layer.

9. The method of claim 1, wherein the step of etching the second dielectric layer includes an anisotropic etching method.

10. The method of claim 1, wherein the etching step to remove the second dielectric layer includes using the inter-layer dielectric layer as an etch-removal stop layer.

11. The method of claim 1, wherein the step of forming the first conductive layer includes depositing polysilicon.

12. The method of claim 1, wherein the step of forming the dielectric film layer includes depositing material that has a high dielectric constant.

13. The method of claim 1, wherein the step of forming the dielectric film layer includes depositing tantalum pentoxide.

14. The method of claim 1, wherein the step of forming a first titanium nitride layer over the dielectric film layer includes physical vapor deposition.

15. The method of claim 1, wherein the step of forming a second titanium nitride layer over the first titanium nitride layer includes collimator physical vapor deposition.

16. A method for forming the cell electrode of a DRAM capacitor, wherein a substrate having a storage electrode formed thereon and a dielectric film layer over the storage electrode is provided, the method comprising:

depositing a first titanium nitride layer over the dielectric film layer using a physical vapor deposition process; and depositing a second titanium nitride layer over the first titanium nitride layer using a collimated physical vapor deposition process.

17. The method of claim 16, wherein the step of forming the dielectric film layer includes depositing material having a high dielectric constant.

18. The method of claim 16, wherein the step of forming the dielectric film layer includes depositing tantalum pentoxide.

19. The method of claim 16, wherein after the step of forming the titanium nitride layer, further includes depositing a doped polysilicon layer over the titanium nitride layer.

20. A method for manufacturing a DRAM capacitor comprising:

providing a substrate having a field effect transistor formed thereon, wherein the field effect transistor includes a source region and a drain region;

forming a first dielectric layer and then an inter-layer dielectric layer over the substrate;

etching the inter-layer dielectric layer to form a pattern having a narrow opening;

forming a second dielectric layer over the inter-layer dielectric layer;

etching the second dielectric layer to form a pattern having a wide opening exposing the narrow opening, then continuing etching down through the first dielectric layer, transferring the pattern on the narrow opening to the first dielectric layer to form a contact window that exposes a source/drain region;

forming a first conductive layer over the substrate covering the wide opening and completely filling the contact window so that the conductive layer is electrically coupled to the exposed source/drain region;

removing the second dielectric layer to expose the inter-layer dielectric layer and the conductive layer;

forming a dielectric film layer over the exposed first conductive layer;

forming a first titanium nitride layer over the dielectric film layer using a physical vapor deposition process; and forming a second titanium nitride layer over the first titanium nitride layer using a collimated physical vapor deposition process resulting in a composite titanium nitride layer that acts as a cell electrode.

21. The method of claim 20, wherein the step of forming the first dielectric layer and the second dielectric layer includes depositing silicon dioxide.

22. The method of claim 20, wherein the step of forming the first dielectric layer and the second dielectric layer includes depositing borophosphosilicate glass.

23. The method of claim 20, wherein the material for forming the first dielectric layer and the second dielectric layer is different from the material used for forming the inter-layer dielectric layer.

24. The method of claim 20, wherein the step of forming the inter-layer dielectric layer includes depositing silicon nitride.

25. The method of claim 20, wherein the step of forming the inter-layer dielectric layer includes depositing silicon oxynitride.

26. The method of claim 20, wherein the step of etching the inter-layer dielectric layer to form a pattern includes an anisotropic etching method.

27. The method of claim 20, wherein the step of etching the second dielectric layer to form a pattern includes using the inter-layer dielectric layer as an etching stop layer.

28. The method of claim 20, wherein the step of etching the second dielectric layer includes an anisotropic etching method.

29. The method of claim 20, wherein step of etching to remove the second dielectric layer includes using the inter-layer dielectric layer as an etch-removal stop layer.

30. The method of claim 20, wherein the step of forming the first conductive layer includes depositing polysilicon.

31. The method of claim 20, wherein the step of forming the dielectric film layer includes depositing material having a high dielectric constant.

32. The method of claim 20, wherein the step of forming the dielectric film layer includes depositing tantalum pentoxide.

33. The method of claim 20, wherein after the step of forming the titanium nitride layer, further includes depositing doped polysilicon over the titanium nitride layer.

34. The method of claim 20, wherein after the step of forming the titanium nitride layer, further includes depositing tungsten silicide over the titanium nitride layer.

* * * * *